United States Patent
Fast, Jr. et al.

(10) Patent No.: US 10,594,317 B1
(45) Date of Patent: Mar. 17, 2020

(54) BLEEDING SWITCHING REGULATOR POWER RAIL THROUGH SWITCHING REGULATOR GROUND SIDE SWITCH

(71) Applicant: INTERNATIONAL BUSINESS MACHINES CORPORATION, Armonk, NY (US)

(72) Inventors: William Fast, Jr., Houston, TX (US); Abraham Garcia, Houston, TX (US); Adrian Glover, Katy, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/173,268

(22) Filed: Oct. 29, 2018

(51) Int. Cl.
| H03B 1/00 | (2006.01) |
| H03K 17/693 | (2006.01) |
| H03K 17/0812 | (2006.01) |

(52) U.S. Cl.
CPC ..... H03K 17/693 (2013.01); H03K 17/08122 (2013.01)

(58) Field of Classification Search
CPC .... H02M 3/156; H02M 3/1588; H02M 3/158; H02M 3/157
See application file for complete search history.

(56) References Cited

U.S. PATENT DOCUMENTS

| 8,400,129 | B2 | 3/2013 | Duyang |
| 8,860,471 | B2 | 10/2014 | Ku et al. |
| 9,172,306 | B2 | 10/2015 | Clavette et al. |
| 9,648,676 | B2 | 5/2017 | Angeles et al. |
| 9,814,105 | B2 | 11/2017 | Chiu et al. |
| 9,837,917 | B1 | 12/2017 | Furtner et al. |
| 2014/0097815 | A1* | 4/2014 | Fujisaki .................. H02M 1/36 323/283 |
| 2016/0126238 | A1* | 5/2016 | Tajima ................ H01L 27/0274 323/313 |
| 2016/0172999 | A1* | 6/2016 | Fogg .................... H02M 3/1588 363/53 |
| 2017/0207699 | A1 | 7/2017 | Nakata |
| 2018/0191249 | A1* | 7/2018 | Su ........................ H02M 3/1588 |

OTHER PUBLICATIONS

Switching Regulator Fundamentals, Application Report SNVA559A, Sep. 2012—Revised Sep. 2016.
Milne, Active Capacitor Discharge Circuit Considerations for FPGAs, Dec. 2015.

* cited by examiner

*Primary Examiner* — Sibin Chen
(74) *Attorney, Agent, or Firm* — ZIP Group PLLC

(57) ABSTRACT

A switching regulator sources a power rail and includes a top side or input rail side switch, a bottom side or ground side switch, and an inductor. When the switching regulator is disabled or generally turned off, a bottom side transistor in the bottom side switch is pulsed on and off, or held on, to drain or bleed the power rail to ground. When the bottom side transistor is off and if there is a voltage across the inductor from the power rail at a switching node, current flows through a body diode of the top side switch to the input rail of the switching regulator.

15 Claims, 4 Drawing Sheets

BLEEDING SWITCHING REGULATOR POWER RAIL THROUGH SWITCHING REGULATOR GROUND SIDE SWITCH

FIELD OF THE INVENTION

Embodiments of the invention generally relate to switching regulators and more particularly to a switching regulator that can pulse its low side to decrease its power rail bleed time.

DESCRIPTION OF THE RELATED ART

Devices which utilize various complicated circuits and integrated circuit(s) (IC), often use large amounts of capacitance on their power rails to stabilize the direct current (DC) voltage sources. A given power rail is often sourced by a regulator that requires its own set of output capacitors, adding to the total amount of capacitance on the power rail. A problem arises when a power rail needs to be shut off quickly. Many ICs have multiple power rails powering them. These power rails often need to be turned off in a predetermined sequenced order to follow the specification of the IC. Turning off the power rails out of this order can, for example, cause damage to the IC.

There may be a case where a first power rail that is required to be turned off has a large amount of capacitance and a next power rail to be turned off has little capacitance. The power rail with the relatively large amount of capacitance will generally bleed off such charge more slowly after the regulator has been turned off. The power rail with the relatively small amount of capacitance will generally bleed off such charge more quickly. Even though the two regulators that source the respective power rails have been turned off in the correct order, there may be a voltage still present in the IC on the first power rail after the second power rail has gone to ground, thus violating the specification of the IC.

One current solution to this problem is to include bleed resistors, connected in parallel to loads, which bleed off the power rail charge more quickly. But these bleed resistors always burn power and are therefore inefficient. Another solution is for the IC to include or utilize an additional circuit (internal or external to the IC) that turns on the bleed resistor(s), or similar device, to pull the associated power rail down to ground. Adding the additional circuit, however, adds components, costs, and complexity to the design.

SUMMARY

In an embodiment of the present invention, a method of bleeding charge from a power rail of a switching regulator through a ground side switch of the switching regulator is presented. The method includes, with a controller of the switching regulator, opening an input-rail-side switch of the switching regulator and opening a ground-side switch of the switching regulator. The method includes determining, with the controller of the switching regulator, whether an output voltage at a power rail of the switching regulator is equal to ground. The method further includes, if the output voltage at the power rail of the switching regulator is not equal to ground, with the controller of the switching regulator, closing the ground-side switch of the switching regulator allowing current to flow from the power rail of the switching regulator through a ground-side transistor of the ground-side switch to ground.

In another embodiment of the present invention, a switching regulator is presented. The switching regulator includes a controller, an input-rail-side switch connected to a ground-side switch by a switching node, an inductor connected to the switching node and to a power rail, and a capacitor connected to the power rail. The controller is configured to open the input-rail-side switch and open the ground-side switch of the switching regulator upon receipt of a signal to turn off the switching regulator. The controller is configured to determine whether an output voltage at the power rail is equal to ground. The controller is further configured to, if the output voltage at the power rail is not equal to ground, close the ground-side switch and allow current to flow from the power rail through a ground-side transistor of the ground-side switch to ground.

In yet another embodiment of the present invention, an integrated circuit is presented. The integrated circuit includes a switching regulator. The switching regulator includes a controller, an input-rail-side switch connected to a ground-side switch by a switching node, an inductor connected to the switching node and to a power rail, and a capacitor connected to the power rail. The controller is configured to open the input-rail-side switch and open the ground-side switch of the switching regulator upon receipt of a signal to turn off the switching regulator. The controller is configured to determine whether an output voltage at the power rail is equal to ground. The controller is further configured to, if the output voltage at the power rail is not equal to ground, close the ground-side switch and allow current to flow from the power rail through a ground-side transistor of the ground-side switch to ground.

These and other embodiments, features, aspects, and advantages will become better understood with reference to the following description, appended claims, and accompanying drawings.

DETAILED DESCRIPTION

A switching regulator sources a power rail and includes a top side or input rail side switch, a bottom side or ground side switch, and an inductor. When the switching regulator is disabled or generally turned off, a bottom side transistor in the bottom side switch is pulsed on and off, or held on, to drain or bleed the power rail to ground. When the bottom side transistor is off and if there is a voltage across the inductor from the power rail at a switching node, current flows through a body diode of the top side switch to the input rail of the switching regulator.

Figure 1:
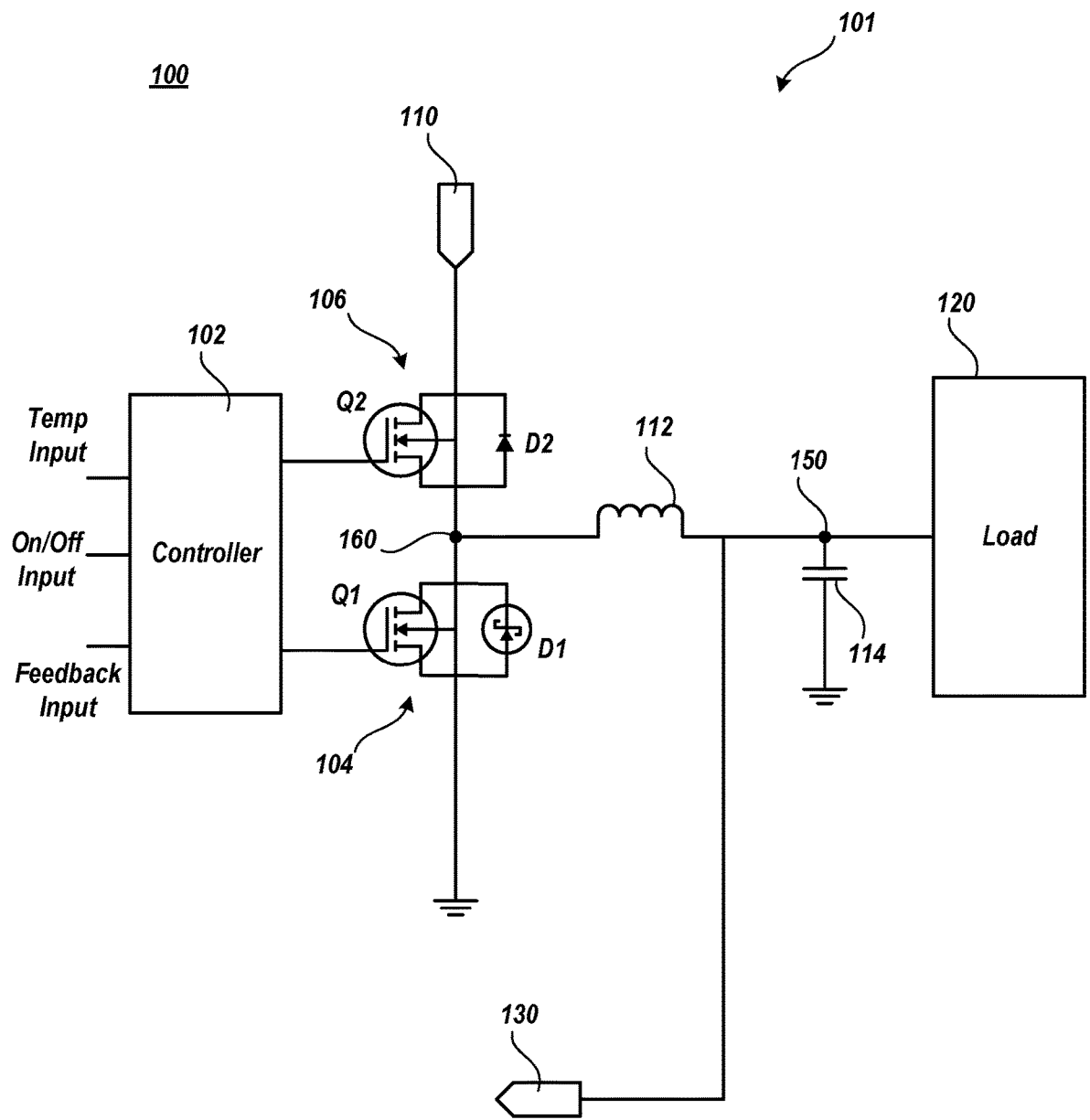
FIG. 1 illustrates a circuit diagram of an exemplary switching regulator for implementing various embodiments of the invention.

FIG. 1 illustrates a circuit diagram of an exemplary IC 100 that includes a switching regulator 101 for implementing various embodiments of the invention. In some embodiments, IC 100 may also include a load 120 within the IC 100 that is connected to a power rail 150 of the switching regulator 101. In other embodiments, power rail 150 of IC 100 may be connected to a load 120 external to the IC 100. The switching regulator 101 may include a controller 102, a bottom switch 104, a top switch 106, an input rail 110, an inductor 112, a power rail 150, and/or capacitor(s) 114. The bottom switch 104 may include a FET Q1 and a directional diode D1. Likewise, the top switch 106 may include a FET Q2 and a directional diode D2.

The basic operation of switching regulator 101 has the current in inductor 112 controlled by bottom switch 104 and top switch 106. Beginning with top switch 106 open (Q2 is off) and the bottom switch 104 closed (Q1 is on), the current in the circuit is zero. When top switch 106 is first closed (Q2 is on) and when bottom switch 104 is first open (Q1 is off), the current will begin to increase, and inductor 112 will produce an opposing voltage across its terminals in response to the changing current. This voltage drop across inductor 112 counteracts the voltage input rail 110 and therefore reduces the net voltage of power rail 150.

Over time, the rate of change of current decreases, and the voltage across inductor 112 also then decreases, increasing the voltage of power rail 150. During this time, inductor 112 stores energy in the form of an electromagnetic field. If top switch 106 is open (Q2 is off) and the bottom switch 104 closed (Q1 is on) while the current is still changing, then there will be a voltage drop across inductor 112, so the voltage at power rail 150 is less than the voltage at input rail 110.

When top switch 106 is open (Q2 is off), D2 serves as a current path back into the input rail 110 when there is a reverse voltage present at switch node 160. This reversed direction would be due to back electromagnetic field produced by inductor 112. This back electromagnetic field is caused by Q1 closing and suddenly stopping current flow in that direction of inductor 112. In other words, when Q1 is on, the inductor 112 current increases. When Q1 turns off, the inductor 112 current has no place to go so the voltage at node 160 increases until it is higher than the voltage at input rail 110 by the forward turn on voltage of D2 and the current is allowed to pass into input rail 110. This protects both Q1 and Q2 from seeing potentially destructive voltages (e.g., exceeding Vds absolute maximum/minimum ratings, or the like).

When top switch 106 is again opened (Q2 is off) and the bottom switch 104 is again closed (Q1 is on), input rail 110 is removed from the circuit, and the current will decrease. The decreasing current will produce a voltage drop across inductor 112 (opposite to the drop of the opposing switching state), and now the inductor becomes a current source. The stored energy in inductor 112 supports current flow through power rail 150. This current, flowing while input rail 110 is disconnected, when concatenated with the current flowing when input rail 110 is connected, totals to current greater than the average input current. The "increase" in average current makes up for the reduction in voltage at power rail 150 relative to the voltage at input rail 110, and ideally preserves the power provided to load 120. If top switch 106 is again closed (Q2 is on) and the bottom switch 104 is again opened (Q1 is off) before inductor 112 fully discharges, the voltage at power rail 150 is greater than ground.

To reduce voltage ripple, capacitor(s) 114 may be added between power rail 150 and ground.

In some implementations, one or more switching regulator(s) 100 may be packaged within the same IC 100.

Controller 102 includes two or more outputs and controls when current is applied to Q1 and Q2, respectively, in order to turn on and when to turn off Q1 and Q2. Generally, during normal switching regulator operation, when controller 102 applies current to Q1 to turn on Q1, controller 102 ceases to apply current to Q1 to turn off Q2, and vice versa.

Controller 102 includes one or more inputs. Controller 102 may include an on/off input that receives an on/off signal from another circuit, device, or the like. When controller 102 receives an on signal at the on/off input it generally puts switching regulator 101 in the on switching state, as is described above, in which power rail 150 is to operate with a non-ground voltage. When controller 102 receives an off signal at the on/off input it generally puts switching regulator 101 in the off switching state whereby power rail 150 is to have a non-ground voltage.

Controller 102 may have one or more over-current sensing input(s), such as a local temperature input and/or a feedback voltage input. The local temperature input may receive a signal that indicates a local or operating temperature of IC 100 and/or switching regulator 101. This temperature signal may be sent from another device or circuit within IC 100 or from a circuit, device, or the like, that is outside of IC 100 and received by controller 102. The voltage feedback input may receive a signal that indicates the voltage of power rail 150 from feedback rail 130. Controller 102 may utilize the one or more over-current sensing input(s) to determine whether Q1 may be damaged if current from power rail 150 is bled through Q1 to ground when switching regulator 101 receives an off signal at the on/off input.

Please add to the normal switching regulator operations description above if I missed anything or described the function incorrectly.

Switching regulator 101 may further include a switch node 160 that electrically connects bottom switch 104, top switch 106 and inductor 112.

Figure 2:
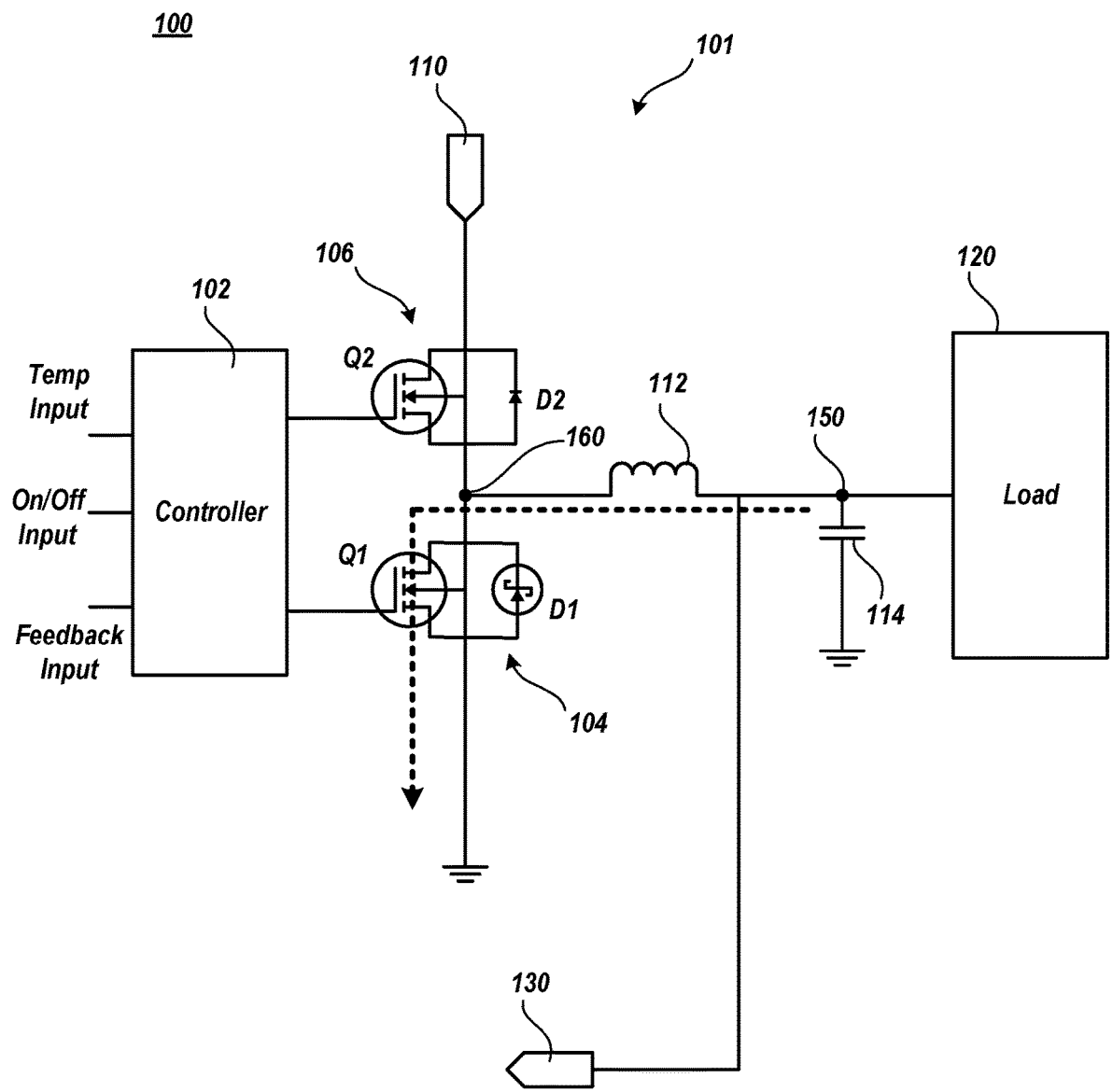
FIG. 2 illustrates a circuit diagram of an exemplary switching regulator for implementing various embodiments of the invention.

FIG. 2 illustrates a circuit diagram of exemplary switching regulator 101 for implementing various embodiments of the invention.

In normal "on" mode operation, controller 120 has received an on signal at the on/off input and controller 120 would be resulting pulsing both Q1 and Q2 in opposition to each other to regulate an output voltage at node 150. Further, controller 120 may sample the voltage at 130 to adjust the duty cycle of the on states of the Q1 and Q2.

Upon switching regulator 101 receiving an off signal at the on/off input, controller 102 turns off Q2 so as to remove voltage from switching regulator 101. Similarly, controller 102 may turn off Q1 to subsequently control the bleeding of charge from capacitor 114 through inductor 112 and through Q1. At such instance, voltage is initially present at the power rail 150 due to charge being held in capacitor 114. To bleed off this voltage, controller 102 pulses on or turns on Q1 to drain the voltage of power rail 150 to ground. The charge held in capacitor 114 drains through inductor 112 and Q1 to ground, as is depicted by the dotted line path. Controller 102 may determine when to pulse on or turn on and off Q1 by determining whether a voltage is still present at power rail 150. For example, if controller 102 determines that the voltage at power rail 150 is non-ground, controller 102 may cyclically pulse Q1 on and off until the voltage at power rail 150 is at ground potential. In some embodiments, controller 102 may further determine when to turn on and off Q1 by determining whether an over current condition is present that would result in potential or likely damage of Q1, if Q1 were to be turned on to allow the current held in capacitor 114 to drain to ground therethrough. For example, when the over current condition is present, controller 102 may pulse Q1 on for a relatively shorter duration to limit the amount of current that passes from capacitor 114 through Q1 to ground.

When the over condition is not present, controller 102 may pulse Q1 on for a relatively longer duration to more quickly bleed the current from capacitor 114 through Q1 to ground.

Figure 3:
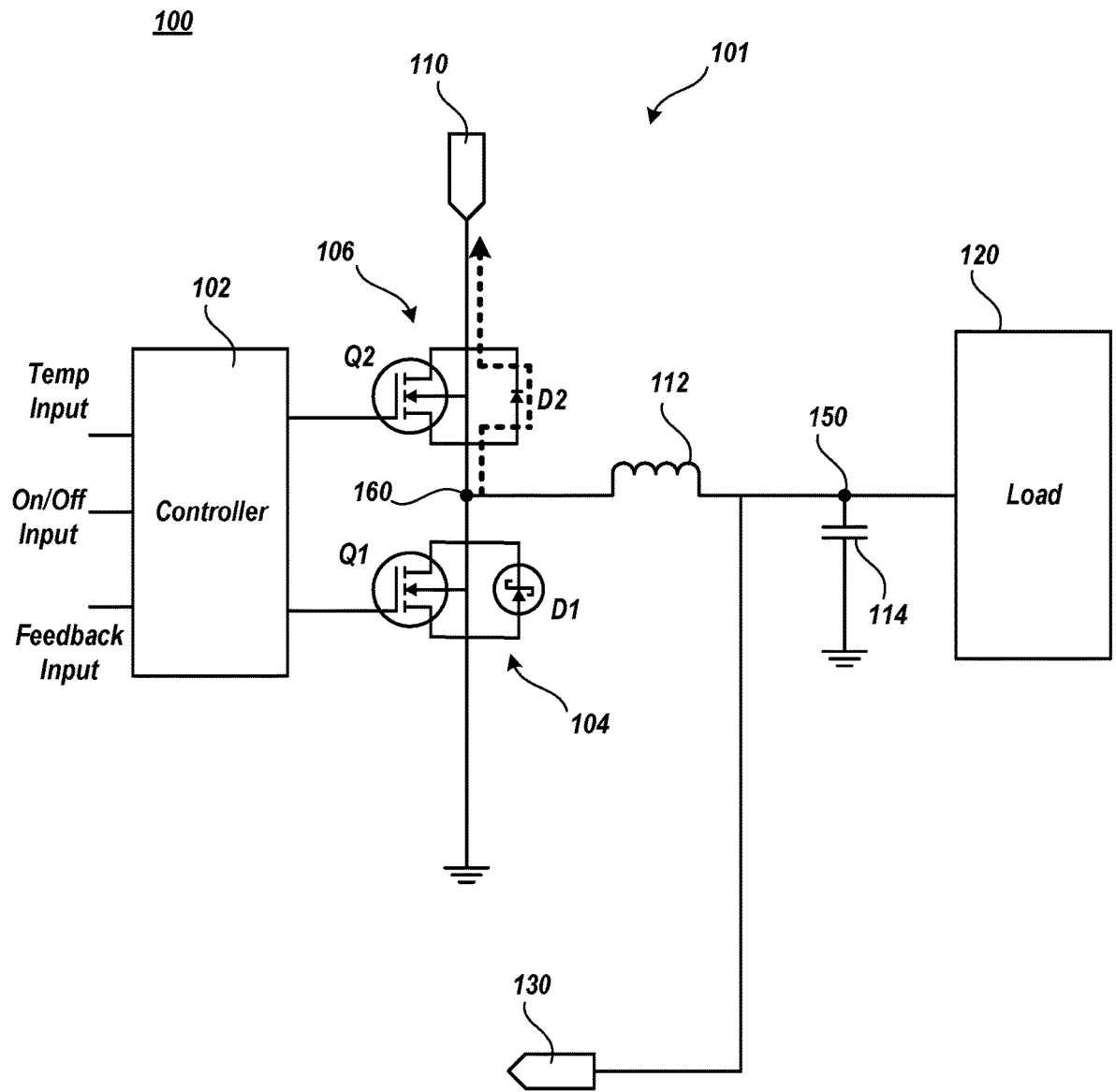
FIG. 3 illustrates a circuit diagram of an exemplary switching regulator for implementing various embodiments of the invention.

FIG. 3 illustrates a circuit diagram of exemplary switching 101 regulator for implementing various embodiments of the invention. During bleed off of voltage present at the power rail 150, controller 102 may turn off Q1 and a voltage may be present at switch node 160. When Q1 is off and when voltage is present at switch node 160, current may be pushed through diode D2 of upper switch 106 and is fed back into input rail 110, as is depicted by the dotted line path. For example, if the voltage at switching node 160 goes higher than the voltage at input rail 110 by the forward voltage threshold of D2, then D2 will conduct the current therethrough from switching node 160 to input rail 110.

Does anything need to happen to push current through D2? For example, does voltage of input rail 110 need to be grounded? If it needs to be grounded, what device makes this happen?

Figure 4:
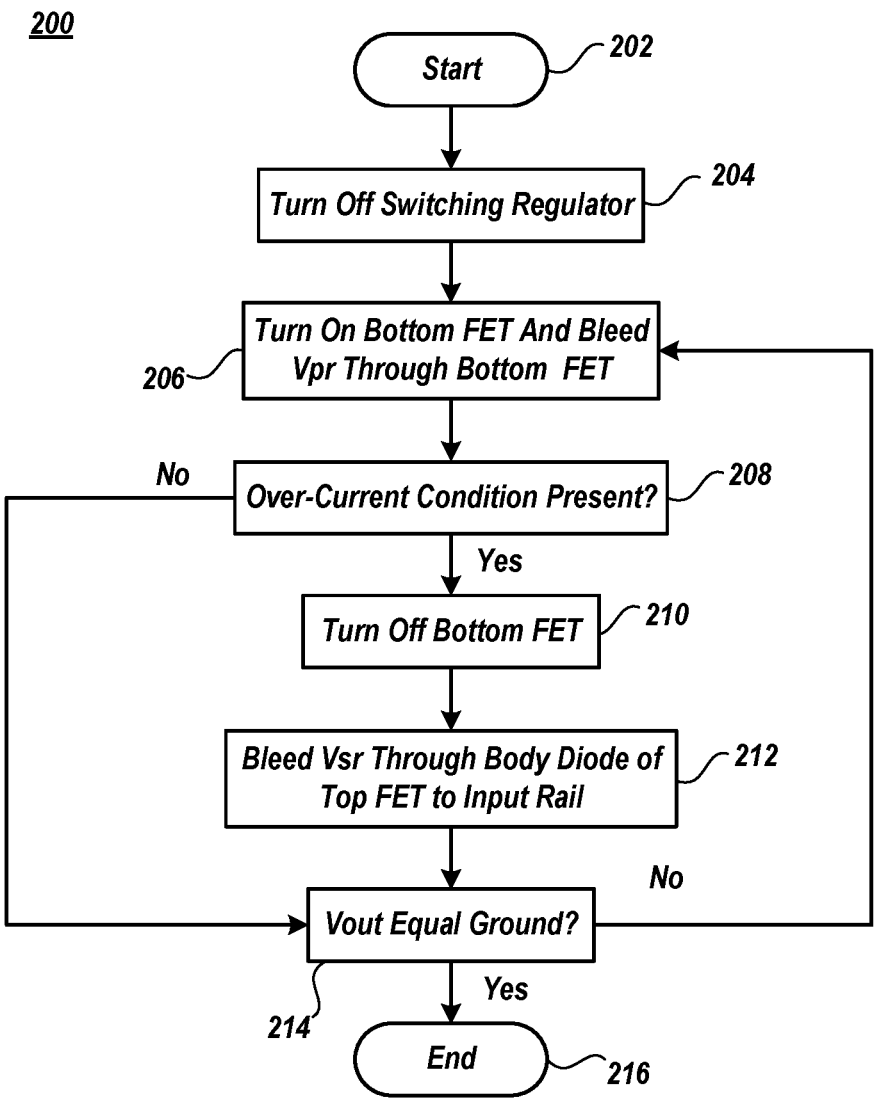
FIG. 4 depicts a method of pulsing a switching regulator low side to bleed charge from an associated power rail, according to various embodiments of the invention.

FIG. 4 depicts a method 200 of pulsing on switching regulator 101 low side or ground side switch 104 to bleed charge from its power rail 150, according to various embodiments of the invention. Method 200 may be utilized by controller 102 to bleed voltage at power rail 150 to ground. Method 200 begins at block 202 and continues with controller 102 receiving a signal that indicates switching regulator 101 should be turned off (block 204). This off signal may be received at controller 102 at the controller 102 on/off input and may be received from another circuit or device within IC 100 or may be received from a circuit or device external to IC 100. In some embodiments, upon the receipt of such off signal, controller 102 may turn off Q1 of lower switch 104 and may turn off Q2 of upper switch 106.

Method 200 may continue with controller 102 turning on Q1 of the bottom or ground side switch 104 to bleed charge from power rail 150 (block 206). Voltage is initially present at the power rail 150 due to charge being held in capacitor 114. To bleed off this voltage, controller 102 pulses on or turns on Q1 to drain the voltage of power rail 150 to ground. The charge held in capacitor 114 drains through inductor 112 and through Q1 to ground.

Method 200 may continue with controller 102 determining whether an over current condition is present that the bleeding of charge from power rail 150 through Q1 will or will potentially damage Q1 (block 208). If an over current condition is present, controller 102 may turn off Q1 (block 210) after a relatively shorter period of time has elapsed since controller 102 has turned on Q1 so as to limit the total charge that bleeds through Q1 to ground. Non limiting exemplary over current conditions may be as follows: the local temperature of switching regulator is above a predetermined temperature threshold, the voltage at power rail 150 is above a predetermined threshold, or the like.

If an over current condition is not present, controller 102 may turn off Q1 (block 210) after a relatively longer period of time has elapsed since controller 102 has turned on Q1 and/or may leave Q1 turned on until the voltage of power rail 150 is equal to ground (block 214), to allow charge at power rail 150 to bleed through Q1 to ground more quickly. If the voltage at power rail 150 is equal to ground (block 214) method 200 ends at block 216. If the voltage at power rail 150 is not equal to ground (block 214) method 200 may return to block 206.

Method 200 may continue subsequent to controller 102 turning off Q1 and a voltage being present at switch node 160. When Q1 is off and when voltage is present at switch node 160, current may be pushed through diode D2 of upper switch 106 and fed into input rail 110 (block 212).

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over those found in the marketplace, or to enable others of ordinary skill in the art to understand the embodiments disclosed herein.

What is claimed is:

1. A method of bleeding charge from a power rail of a switching regulator through a ground side switch of the switching regulator, the switching regulator comprising: a controller; a switching node consisting of a connection to an input-rail-side switch, a connection to a ground-side switch, and an a connection to an inductor; and a power rail consisting of a connection to the inductor, a connection to a capacitor, a connection to a feedback rail, and a connection to a load;

the method comprising:
with the controller, opening the input-rail-side switch and opening the ground-side switch;
determining, with the controller, whether an output voltage at the power rail is equal to ground; and
if the output voltage at the power rail is not equal to ground, with the controller, cyclically closing the ground-side switch by cyclically pulsing on and off a ground-side transistor of the ground-side switch allowing current to flow from the power rail through the ground-side transistor of the ground-side switch until the output voltage at the power rail is equal to ground.

2. The method of claim 1, wherein closing the ground-side switch comprises turning on the ground-side transistor of the ground-side switch until the output voltage at the power rail is equal to ground.

3. The method of claim 1, wherein when the ground-side transistor of the ground-side switch is off and wherein when a switching voltage at the switching node does not equal ground, current flows from the switching node through a input-rail-side diode of the input-rail-side switch to an input rail.

4. The method of claim 3, wherein allowing current to flow from the power rail through the ground-side transistor of the ground-side switch to ground comprises:
allowing current to flow from the capacitor through the inductor.

5. The method of claim 1, further comprising:
prior to closing the ground-side switch, determining with the controller, whether an over-current condition exists that indicates the ground-side transistor would be damaged if the ground-side transistor is turned on; and
reducing, with the controller, a period of the cyclically pulsing on and off of the ground-side transistor, if it is determined that the over-current condition exists.

6. A switching regulator comprising:
a controller;
a switching node consisting of a connection to an input-rail-side switch, a connection to a ground-side switch, and an a connection to an inductor;
a power rail consisting of a connection to the inductor, a connection to a capacitor, a connection to a feedback rail, and a connection to a load;

wherein the controller is configured to:
open the input-rail-side switch and open the ground-side switch of the switching regulator upon receipt of a signal to turn off the switching regulator;
determine whether an output voltage at the power rail is equal to ground; and
if the output voltage at the power rail is not equal to ground, cyclically close the ground-side switch by cyclically pulsing on and off a ground-side transistor of the ground-side switch allowing current to flow from the power rail through the ground-side transistor of the ground-side switch until the output voltage at the power rail is equal to ground.

7. The switching regulator of claim 6, wherein the controller being configured to close the ground-side switch comprises the controller turning on the ground-side transistor of the ground-side switch until the output voltage at the power rail is equal to ground.

8. The switching regulator of claim 6, wherein when the ground-side transistor of the ground-side switch is off and wherein when a switching voltage at the switching node does not equal ground, current flows from the switching node through a input-rail-side diode of the input-rail-side switch to the switching regulator input rail.

9. The switching regulator of claim 8, wherein the controller being configured to allow current to flow from the power rail through the ground-side transistor of the ground-side switch to ground comprises the controller allowing current to flow from the capacitor through the inductor.

10. The switching regulator of claim 6, wherein the controller is further configured to:
prior to closing the ground-side switch of the switching regulator, determine whether an over-current condition exists, the over-current condition indicating that the ground-side transistor would be damaged if the ground-side transistor is turned on; and
reducing a period of the cyclically pulsing on and off of the ground-side transistor, if it is determined that the over-current condition exists.

11. An integrated circuit comprising a switching regulator, the switching regulator comprising:
a controller;
a switching node consisting of a connection to an input-rail-side switch, a connection to a ground-side switch, and an a connection to an inductor;
a power rail consisting of a connection to the inductor, a connection to a capacitor, a connection to a feedback rail, and a connection to a load;
wherein the controller is configured to:
open the input-rail-side switch and open the ground-side switch of the switching regulator upon receipt of a signal to turn off the switching regulator;
determine whether an output voltage at the power rail is equal to ground; and
if the output voltage at the power rail is not equal to ground, cyclically close the ground-side switch by cyclically pulsing on and off a ground-side transistor of the ground-side switch allowing current to flow from the power rail through the ground-side transistor of the ground-side switch until the output voltage at the power rail is equal to ground.

12. The integrated circuit of claim 11, wherein the controller being configured to close the ground-side switch comprises the controller turning on the ground-side transistor of the ground-side switch until the output voltage at the power rail is equal to ground.

13. The integrated circuit of claim 11, wherein when the ground-side transistor of the ground-side switch is off and wherein when a switching voltage at the switching node does not equal ground, current flows from the switching node through a input-rail-side diode of the input-rail-side switch to the switching regulator input rail.

14. The integrated circuit of claim 13, wherein the controller being configured to allow current to flow from the power rail through the ground-side transistor of the ground-side switch to ground comprises the controller allowing current to flow from the capacitor through the inductor.

15. The integrated circuit of claim 11, wherein the controller is further configured to:
prior to closing the ground-side switch of the switching regulator, determine whether an over-current condition exists, the over-current condition indicating that the ground-side transistor would be damaged if the ground-side transistor is turned on; and
reducing a period of the cyclically pulsing on and off of the ground-side transistor, if it is determined that the over-current condition exists.

* * * * *